US012749723B2

(12) United States Patent
Neutzler et al.

(10) Patent No.: US 12,749,723 B2
(45) Date of Patent: Sep. 29, 2026

(54) DYNAMIC CONTROL AND PERFORMANCE ASSESSMENT/OPTIMIZATION OF SECONDARY BATTERY CELL FINISHING (FORMATION/AGING/SORTING/GRADING) UTILIZING SIMULTANEOUS INLINE ELECTROCHEMICAL METHODS AND CLOSED-LOOP PROCESS CONTROL

(71) Applicant: Honeywell International Inc., Charlotte, NC (US)

(72) Inventors: Jay Kevin Neutzler, New Braunfels, TX (US); Carl Fredrik Westerberg, Katy, TX (US); Alec Jacob Falzone, Magnolia, TX (US); Srirama Hariharan, Freising (DE)

(73) Assignee: Honeywell International Inc., Charlotte, NC (US)

( * ) Notice: Subject to any disclaimer, the term of this patent is extended or adjusted under 35 U.S.C. 154(b) by 580 days.

(21) Appl. No.: 18/218,850

(22) Filed: Jul. 6, 2023

(65) Prior Publication Data

US 2025/0015372 A1 Jan. 9, 2025

(51) Int. Cl.

*H01M 10/42* (2006.01)
*G01R 31/36* (2020.01)
*G01R 31/382* (2019.01)
*G01R 31/389* (2019.01)
*H01M 10/04* (2006.01)

(Continued)

(52) U.S. Cl.

CPC .... *H01M 10/4285* (2013.01); *G01R 31/3648* (2013.01); *G01R 31/382* (2019.01); *G01R 31/389* (2019.01); *H01M 10/0404* (2013.01); *G01R 31/385* (2019.01); *G01R 31/3865* (2019.01); *G01R 31/396* (2019.01)

(58) Field of Classification Search

USPC .................................................... 702/63

See application file for complete search history.

(56) References Cited

U.S. PATENT DOCUMENTS 10,330,715 B2 6/2019 Brorein
10,417,919 B1 9/2019 Jayathirtha (Continued)

*Primary Examiner* — Paul D Lee

(74) *Attorney, Agent, or Firm* — Alston & Bird LLP

(57) ABSTRACT

Control, assessment and optimization techniques for manufacturing secondary electrochemical devices to improve the quality, throughput, and safety of cells produced and to facilitate the finishing (formation/aging/sorting/grading) process. A system for dynamic control and optimization of secondary battery finishing process includes a closed-loop process control module that is configured to process real-time in-line manufacturing data derived from at least one of electrochemical impedance spectroscopy (EIS), self-discharge analysis (SDA), amperometric, or potentiometric battery measurements. Cell formation can be reduced from the several days with prior art technology to less than 24 hours, and aging can be reduced from 2-3 weeks to less than an hour. A control module provides real-time feedback to predecessor operations/materials for confirmations, refinements, corrections, and/or recognition or isolation of better/worse performance characteristics. It also provides feedforward information of aspects recognized that may indicate performance deviations from the norm.

19 Claims, 4 Drawing Sheets

(51) Int. Cl.
*G01R 31/385* (2019.01)
*G01R 31/396* (2019.01)

(56) References Cited

U.S. PATENT DOCUMENTS

| | | | | |
|---|---|---|---|---|
| 10,566,817 | B2 | 2/2020 | Tkachenko | |
| 11,243,258 | B2 | 2/2022 | Ramezan Pour Safaei | |
| 11,404,887 | B2 | 8/2022 | Fauteux | |
| 11,422,102 | B2 * | 8/2022 | Christophersen .... | G01N 27/416 |
| 2009/0193936 | A1 | 8/2009 | Lu | |
| 2019/0317152 | A1 | 10/2019 | Ballantine | |
| 2019/0363409 | A1 | 11/2019 | Miura | |
| 2019/0372177 | A1 | 12/2019 | Miura | |
| 2021/0257840 | A1 * | 8/2021 | Fauteux ............ | H01M 10/0525 |
| 2022/0029432 | A1 * | 1/2022 | Klee ..................... | H02J 7/0029 |
| 2022/0283243 | A1 * | 9/2022 | Keene .................. | G01R 31/367 |
| 2022/0317199 | A1 * | 10/2022 | Ghantous ............. | G01R 31/392 |
| 2023/0160967 | A1 * | 5/2023 | Huh ....................... | B26D 1/085<br>29/705 |
| 2023/0258736 | A1 * | 8/2023 | Pressgrove ........ | G01R 31/3865<br>324/434 |

* cited by examiner

DYNAMIC CONTROL AND PERFORMANCE ASSESSMENT/OPTIMIZATION OF SECONDARY BATTERY CELL FINISHING (FORMATION/AGING/SORTING/GRADING) UTILIZING SIMULTANEOUS INLINE ELECTROCHEMICAL METHODS AND CLOSED-LOOP PROCESS CONTROL

FIELD OF THE INVENTION

The invention generally relates to manufacturing electrochemical batteries and more particularly to control, assessment and optimization techniques to improve the quality, throughput, and safety of secondary batteries such as lithium-ion cells in the finishing process.

BACKGROUND OF THE INVENTION

A lithium-ion cell is one type of secondary battery and contains four main parts: a positive electrode (a cathode), a negative electrode (an anode), a separator that is placed between the electrodes to prevent contact and shorting, and an electrolyte. Examples of a cathode active material may include but not limited to: mixed-metal oxides, metal phosphates, or related materials. Examples of anode materials may include but are not limited to: graphite, silicon, or composites thereof. The electrolyte provides transport of the ions, and may be a liquid, solid, or liquified gas. Battery manufacture begins with the fabrication of large sheets of double-side coated anode copper substrates and double-side coated cathode aluminum substrates. The electrodes are manufactured on a continuous roll-to-roll process where pre-mixed anode or cathode material is coated onto a sheet of metal substrate, which functions as current collectors. The electrode sheets are slit into appropriate-sized of double-side coated metal substrates.

There are two main methods to construct individual cells. Cell winding of electrodes and separators into a "jelly roll" is one and combining discrete electrode sheets with separator film with either a z-fold or stacked in between each electrode is another. Cylindrical and some prismatic cells are wound on rotating machines fed with rolls of anode and cathode electrodes and two rolls of separator film. Pouch cells and some prismatic cells utilize robotic arms to alternate the anode and cathode stack as separator film from overhead unrolls to interlace the stack, which is completed with a rotation of separator film.

A lithium-ion cell is assembled in its uncharged state. The first charging, or formation, of a cell is critical to expected cycle life and energy capacity. This involves multiple stages where the rate and duration and current/voltage limits of each step are designed to form a metastable passivation layer, called the solid electrolyte interface (SEI) layer on the anode. Forming the SEI layer consumes some of the lithium from the available lithium in the cell and is a product of electrolyte decomposition. Similarly, a cathode electrolyte interface (CEI) also develops which provides uniform passivation to the positive electrode. This CEI layer affords maintaining the ionic transport pathway, while suppressing undesirable side reactions between the positive electrode particles and the electrolyte. However, for the anode SEI, forming too thin SEI layer, and/or non-uniform layer may permit electrolyte ions to flow to the anode material, increasing the risk of lithium plating and/or lithium dendritic growth and reducing the life cycle of the cell. Producing the proper SEI layer thickness is one of the critical process parameters in the cell production process, more specifically the cell finishing area. Cell finishing operations also include degassing, which is the result of the formation process, and cell aging, which screens for cells that have unacceptable levels of self-discharge.

Formation and finishing processes are isolated from the rest of the production process as fires can occur when faulty cells are charged for the first time, which may result in rapid failure otherwise known as "thermal runaway". Due to the long duration required to perform the formation and aging processes, often three weeks or more, this process typically takes up the largest area in the factory, represents a significant work in progress inventory, and consumes approximately 40% of the required capital expenditure for major factory projects. Currently, formation and aging of lithium-ion cells is performed following a static recipe which is not modulated during either process based on real-time observations.

In particular, finishing encompasses the functions of formation for charging/discharging to "form" the solid electrode/electrolyte interfaces SEI for the anode and CEI cathode. This is a lengthy and critical process which greatly influences the longevity of the cell life. It can take at least 24 to 48 hours and requires significant space in racking, power electronics, energy, and in-process inventory. The process of aging battery cells is even more time consuming, taking 2-3 weeks. This also demands significant floor space to stage and store the cells. Determining the ΔOCV, or voltage drop, is a common test to determine cell quality and eventual grading of cells. A major deficiency in this approach is that the delay may allow significant numbers of substandard batteries to be produced without timely quality feedback to rectify which results in the accumulation of scrap and/or suboptimal products of reduced value. As is apparent, this conventional methodology impedes cell throughput and prevents the optimization of Li-ion cell performance in operando.

SUMMARY OF THE INVENTION

The present invention is based, in part, on the development of a method for dynamic performance assessment and control of the secondary battery cell finishing that encompasses the formation, aging, sorting and grading steps in battery production. The method utilizes simultaneous, inline, multi-frequency fast-response electrochemical impedance spectroscopy (EIS) and closed-loop process control, along with real-time data analytics, for the battery cell finishing process. This method reduces time, capital expenditures, operational expenditures, and increases throughput and quality of the battery cells. In addition, the invention allows for fast performance feedback to predecessor operations for confirmations, refinements, and/or corrections. The present invention is applicable to any secondary battery type which undergoes a formation/aging process. While the invention will be illustrated in the production of lithium-ion battery cells, it is understood that the invention is applicable also to sodium-ion and solid-state batteries, for example.

The invention addresses the high throughput, superior-quality demands of large-scale mass production facilities. Employing electrochemical techniques such as EIS in the formation and/or aging processes provides capability which is novel in the Li-ion battery production industry. This capability ascertains battery cell ohmic, surface film (SEI/CEI), charge transfer resistances to assure the highest quality "Start-of-life" levels. The dynamic closed-loop-control enables fast recognition of quality defects for upstream adjustments and corrections to minimize downtime and scrap waste. For example, "bad cells" can be recognized early during formation process so as to obviate aging. Advanced charging-discharging algorithms are employed to optimize and smartly charge/discharge batteries in the formation process and ensure plant and personnel safety.

The invention reduces the formation/aging floorspace requirements and the equipment and capital and operational expenses as compared to conventional systems. In particular, with the present invention, formation time can be dramatically reduced. For example, from the several days with current technology to less than 24 hours for formation, and aging can be reduced from 2-3 weeks with current technology to less than an hour.

In one aspect, the invention is directed to a system for dynamic control and optimization of secondary battery cell finishing process that includes a closed-loop process control module that is configured to govern or process real-time in-line manufacturing data and to determine charge and discharge protocols for lithium-ion batteries during formation and to determine cell performance categorization for lithium-ion batteries during aging. The in-line data is derived from electrochemical impedance spectroscopy (EIS), self-discharge analysis (SDA), amperometric, and/or potentiometric measurements. Process parameter(s) which are monitored by the module include, for example, ohmic resistance $R_\Omega$, charge transfer resistance $R_d$, leakage current $I_{leak}$, open circuit voltage (OCV) and/or voltage drop ($\Delta V$).

In one embodiment, the closed loop functionality of the control module enables comparison of the in-line real time process parameters against a set of pre-selected values and/or a computerized supervisory control system. Based on the deviation of the in-line value from the set value, the control module directs the EIS measurement system and/or SDA measurement system to execute a set of pre-configured charge/discharge protocols to bring the measured values closer to the selected target values. Based on the deviations derived from feedback data, the control module can either execute, terminate or implement alternate charge/discharge procedures. This feature of the closed loop feedback control enables optimization of the time spent in formation and/or aging processes which is not possible in conventional off-line formation and aging stations.

In another aspect, the invention is directed to a system for feedback alert and/or control of secondary battery cell finishing process which includes a closed-loop process control module that is configured to govern or process real-time in-line manufacturing data from charge/discharge functions, EIS measurements, SDA measurements, amperometric systems, and/or potentiometric systems to identify and quantify performance deviations from the norm and identify previous operation(s) deviations for their potential contributions from that standard. Representative examples of process parameters that are monitored include, for example, current (I), voltage (V), ohmic resistance $R_\Omega$, charge transfer resistance $R_{ct}$, leakage current $I_{leak}$, open circuit voltage (OCV) and voltage drop ($\Delta V$), etc.

In yet another aspect, the invention is directed to a system for feedforward alert and/or control of secondary battery cell finishing process that includes a closed-loop process control module that is configured to govern or process the real-time in-line manufacturing data from charge/discharge functions, EIS measurements, SDA measurements, amperometric, and/or potentiometric systems to identify and quantify performance deviations from the standard or norm and identify post operation(s) battery materials for similar attributes for potential contributions from that standard or norm for laboratory analysis or sequestering.

The performance deviations, which can be characterized as being better or worse than normal or standard battery acceptable performance, can be assessed by various techniques such as: (i) statistical analysis of the process parameters, (ii) rate-of change comparison, (iii) application of parameter limits, (iv) data extraction (dQ/dV), (v) machine learning, (vi) artificial intelligence. Historical data of the material components used in the batteries and process parameters employed in fabricating the batteries are evaluated to determine their contributions to performance deviations. The operating parameters in the battery manufacturing line, particularly in the formation, aging, sorting and grading steps, are constantly upgraded.

The closed-loop process control modules can be configured to automatically adjust material and process parameters to establish normal battery performance and to identify material and process parameters that are detrimental and which then subject to quality and/or safety review. The control module can also be configured to identify beneficial material and process parameters that improve battery performance. Finally, the control module can be configured to automatically trigger alerts and/or sequester materials for additional evaluation.

DETAILED DESCRIPTION OF PREFERRED EMBODIMENTS

Figure 1:
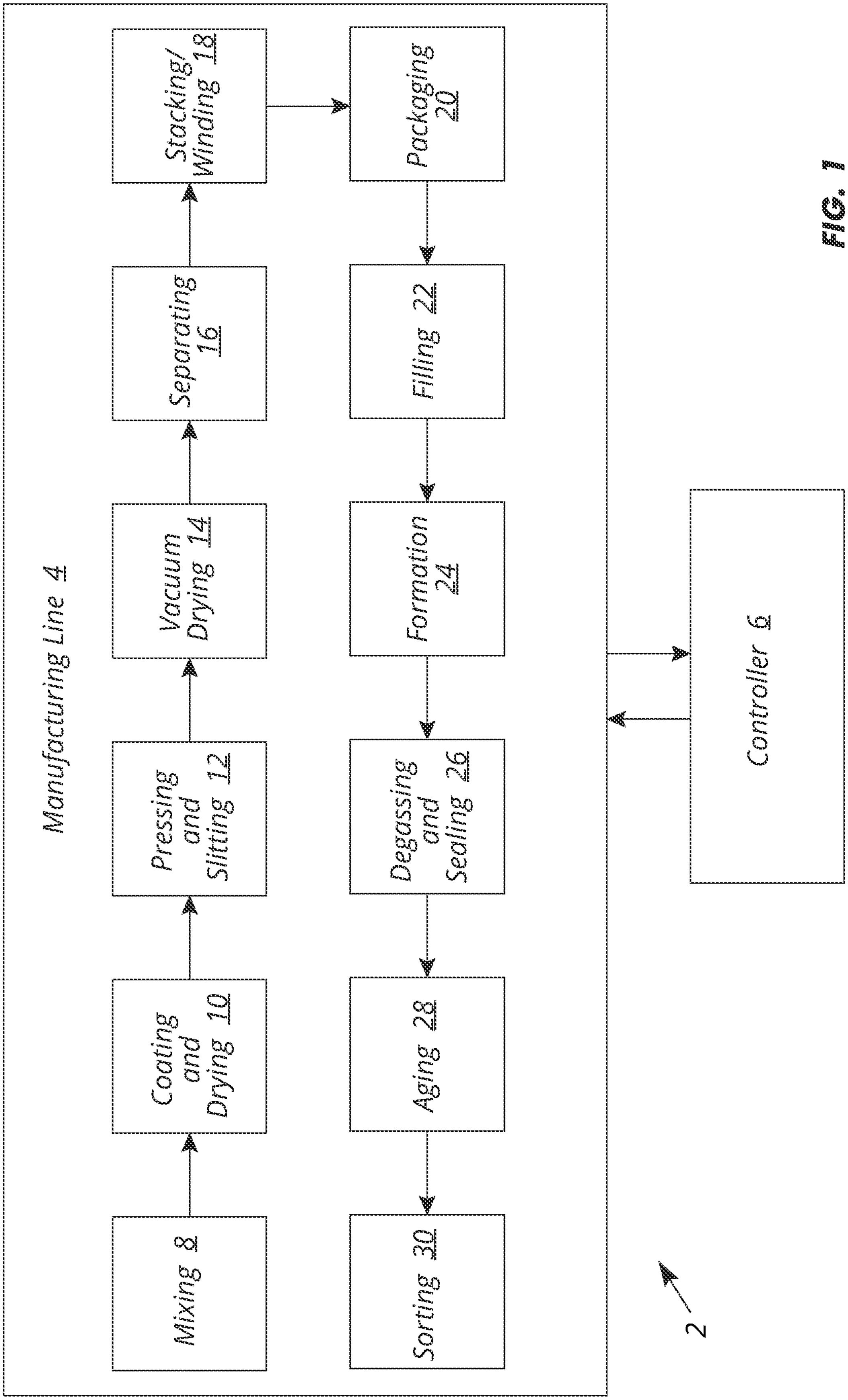
FIG. 1 shows a system that includes a manufacturing line and controller for the production of lithium-ion batteries.

FIG. 1 illustrates a system 2, that includes a manufacturing line 4 and controller 6, for making electrochemical cells and batteries. The manufacturing line 4 is configured to perform operations in the fabrication process. In mixing station 8, individual anode and cathode slurries are prepared typically in batches. The anode slurry is prepared by mixing various anode components which include, for example, graphite, binders, and conducting agents, in a solvent. The sources, lots, amounts of each component and the mixing parameters employed such as, temperature and tank stirring speeds, for each batch are stored in the memory of controller 6. Similarly, the cathode slurry is prepared by mixing various cathode components which include, for example, lithium oxides, binders and conducting agents in a solvent. Lithium oxides include, for instance, lithium nickel manganese cobalt (NMC), lithium iron phosphate (LFP), lithium cobalt oxide (LCO), and lithium nickel cobalt alumina (NCA). The sources, lots, amounts of the components and the mixing parameters for each batch are stored in the memory of controller 6. In the case of use of a solid electrolyte, an electrolyte slurry may be prepared by mixing process. The material inception history, genealogy, amounts of the components, and mixing parameters for each batch are stored in the memory of controller 6.

In coating and drying station 10, the anode and cathode slurries prepared in the mixing station are coated onto metal substrates to form electrodes. The anode or cathode slurry is coated either continuously in lanes or intermittently in patches on both sides of the current collector using a slot die coating head, or other coating method. The wet coated foil is fed directly into a long drying oven to evaporate the solvent. The thickness and the coat weight applied to the electrode coating are measured by optical, X-ray, and/or beta-ray absorption metrology and this feedback can be used control the coating machine. The drying stage is one of the most energy intensive steps of the cell production process. The drying process itself also imparts several critical quality aspects to the electrode such as even distribution of pores due to the evacuation of the solvent (porosity), avoiding a hard surface and blistering, and using just the right amount of energy to achieve the desired dryness. After coating, the coated foils undergo a calendering process where they are compressed by a rotating pair of rollers in step 12. This process helps adjust the final physical properties (thickness, bonding, conductivity, density, and porosity) of the electrodes.

The operating parameters, conditions, quality aspects of the electrode coating and calendaring processes are monitored by various inline sensors and the data stored in controller 6. To ensure high quality Li-ion batteries, it is critical that active materials in the anode and cathode slurries are uniformly mixed. In addition, (i) the same coating weight should be on both sides of the electrode, (ii) the top and bottom coatings are aligned, and (iii) the same thickness and density on are both sides of the electrode, which affects porosity and the subsequent 'wettability' during electrolyte filling. The electrodes should be free of contamination or defects (such as holes and missing coating) and the required loading ($mAh/cm^2$) to meet the cell energy storage requirement.

Specific materials, process parameters, deviation, etc. are stored in controller 6.

After calendering, the finished electrodes are cleaned and fed into slitting machines to be cut into narrow strips and coiled into "daughter-rolls" at slitting station 12. Vision systems may be utilized to assure proper operation and/or detect non-standard detect proper Specific materials, process parameters, deviation, etc. are stored in controller 6.

The coils are then sent to drying station 14 where a vacuum oven removes residual moisture and solvent.

In separating station 16, cell separator materials readied for winding, or die-cut for cell-stacking, or readied for z-folding methods depending on the cell format process. Separator materials may also be calendered to form a separator film, or slurry cast, such as onto a substrate and cured as a discreate, on a continuous moving sheet process. Specific materials and process parameters are stored in controller 6.

In stacking/winding station 18, batteries are constructed. Stacking is used to form pouch cells and winding is used to form cylindrical and prismatic cells. Specific materials and process parameters are stored in controller 6.

In packaging station 20, the batteries are encased in protective containers or shells. Specific materials and process parameters are stored in controller 6.

In filling station 22, a liquid electrolyte is added to the batteries. The electrolyte comprises a lithium solution that includes solvents, additives, and salts. The amount of the lithium salt solution added, the volume and/or weight, and the specific proportions, suppliers, dates, batches of the components are recorded in controller 6.

In formation station 24, the batteries are subject to a series of charge and discharge cycles to build solid electrolyte interface (SEI) and cathode electrolyte interface (CEI) protective layers on the anode and cathode, respectively. With the present invention, EIS is employed to ascertain the electrochemical condition of the SEI and/or CEI characteristics. This directly relates to the performance battery cell, in situ, affording dynamic-inline, closed-loop process control. In addition to or instead of EIS measurements, amperometric, potentiometric, and/or self-discharge analysis (SDA) measurements may be utilized for parameter analysis for dynamic response. Representative process parameters that are monitored include, for example, ohmic resistance $R_{\Omega}$, charge transfer resistance $R_{ct}$, leakage current $I_{leak}$, open circuit voltage (OCV) and voltage drop ($\Delta V$). These methods are utilized to optimize the throughput, longevity, quality, and safety of the battery cell.

The data collected from the electrochemical measurements are interpreted by Nyquist plot, Bode plot, or other conventional techniques. The data interpretation affords closed-loop optimization of the formation process for fastest throughput. Additionally, trends may be established to identify poor performing, and out-of-specification cells, or even higher performing.

This can also establish grading/sorting. Interpretation affords traceability from preceding processes, such as, mixing, electrode production (drying, calendering, etc.), cell creation (winding, stacking, welding, electrolyte filling), to be identified as possible defect root cause, in a feedback manner.

In addition, identification of deviations of performance from the norm and identify post operation(s) material for similar attributes for potential contributions that may be utilized feedforward for alert and/or control of materials.

Fast response of measurement-to-feedback/feedforward allows recognition of quality defects for upstream adjustments/corrections to reduce downtime and scrap, thereby reducing formation/aging floorspace & equipment. The overall result is an integrated overarching manufacturing solution.

In degassing and sealing station 26, formation reactions generate various mixtures of hydrogen, carbon-monoxide, carbon-dioxide, hydrocarbons (methane, propane, etc.) and hydrofluorocarbons (HFC's) which are removed from the batteries and then sealed.

In aging station 28, the sealed batteries are subject to regulated heating regiments. With the present invention, self-discharge analysis is employed to measure "leakage current" preferably in microamps for inline process control. Specific process parameters are stored in controller 6.

In sorting station 30, the batteries are graded. Specific grading of batteries, materials, performance, and parameters are stored in controller 6.

To facilitate transfer of the batteries and cells between the formation station 24, degassing and sealing station 26, aging station 28 and sorting station 30, the manufacturing line 4 (FIG. 1) can include automated storage and retrieval systems (AS/RS) and/or autonomous mobile robots (AMR) or other methods of automated material movement. In this fashion, the manufacturing line can accommodate large quantities of batteries with minimum personnel.

Figure 2:
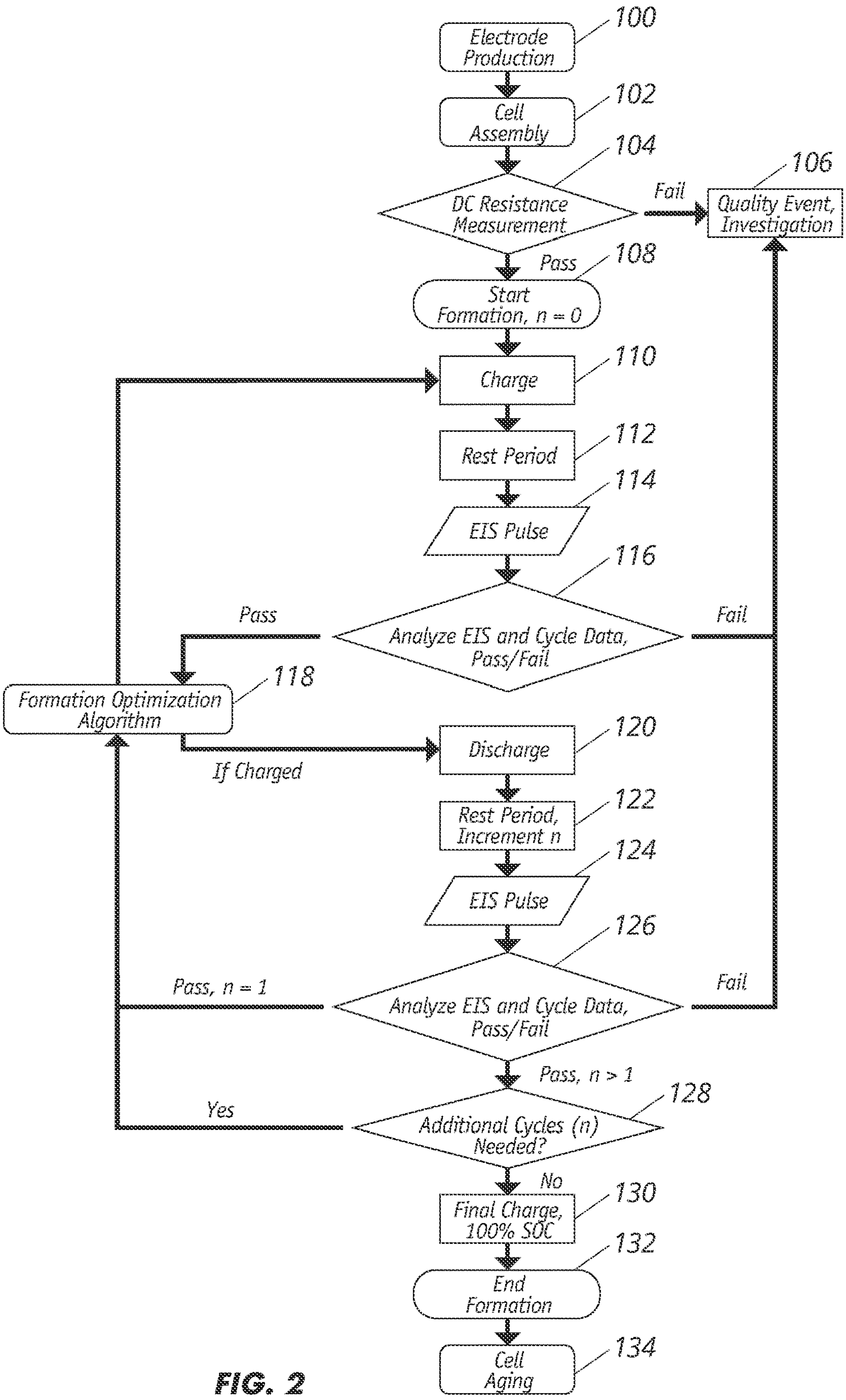
FIG. 2 is a flowchart of the formation process.

FIG. 2 depicts an exemplary formation process wherein electrodes are produced in step 100 and the electrochemical cells are assembled into batteries in step 102. The formation process is controlled by algorithm 118. A plurality of batteries is positioned in a formation station and the batteries are connected to a charging circuit configured to connect to the plurality of batteries where they are subject to direct current resistance measurement 104. Those which fail are removed for quality investigation 106. And those that pass undergo formation 108 wherein the batteries are charged 110 per protocol from algorithm 118, allowed to rest 112, and tested by EIS 114. (Note that the rest step 112 is optional since EIS can be performed in situ with the charging function.) EIS and cycle data analysis 116 is applied; batteries that fail are rejected whereas those that pass continue in the formation process in accordance with formation and optimization algorithm procedure 118. If the batteries are not charged, they proceed to step 110 where they are charged.

Batteries that pass analysis step 116 and which are charged are then discharged in step 120 per protocols from algorithm 118 and rested in step 122 for a length of time n, before being applied with EIS pulses 124. (Note that the rest step 122 is optional since EIS can be performed in situ with the discharging function.) Another analysis protocol 126 removes defective batteries that fail. Those batteries which pass the first time at this stage are returned to step 118 for additional formation. Some batteries which pass the second time can subject to additional charge/discharge cycles if required in step 128. If batteries are in acceptable condition, they proceed to step 130 where they are charged a final time to 100% state-of-charge, to complete formation 132 and forwarded to cell aging 134 step.

Figure 3:
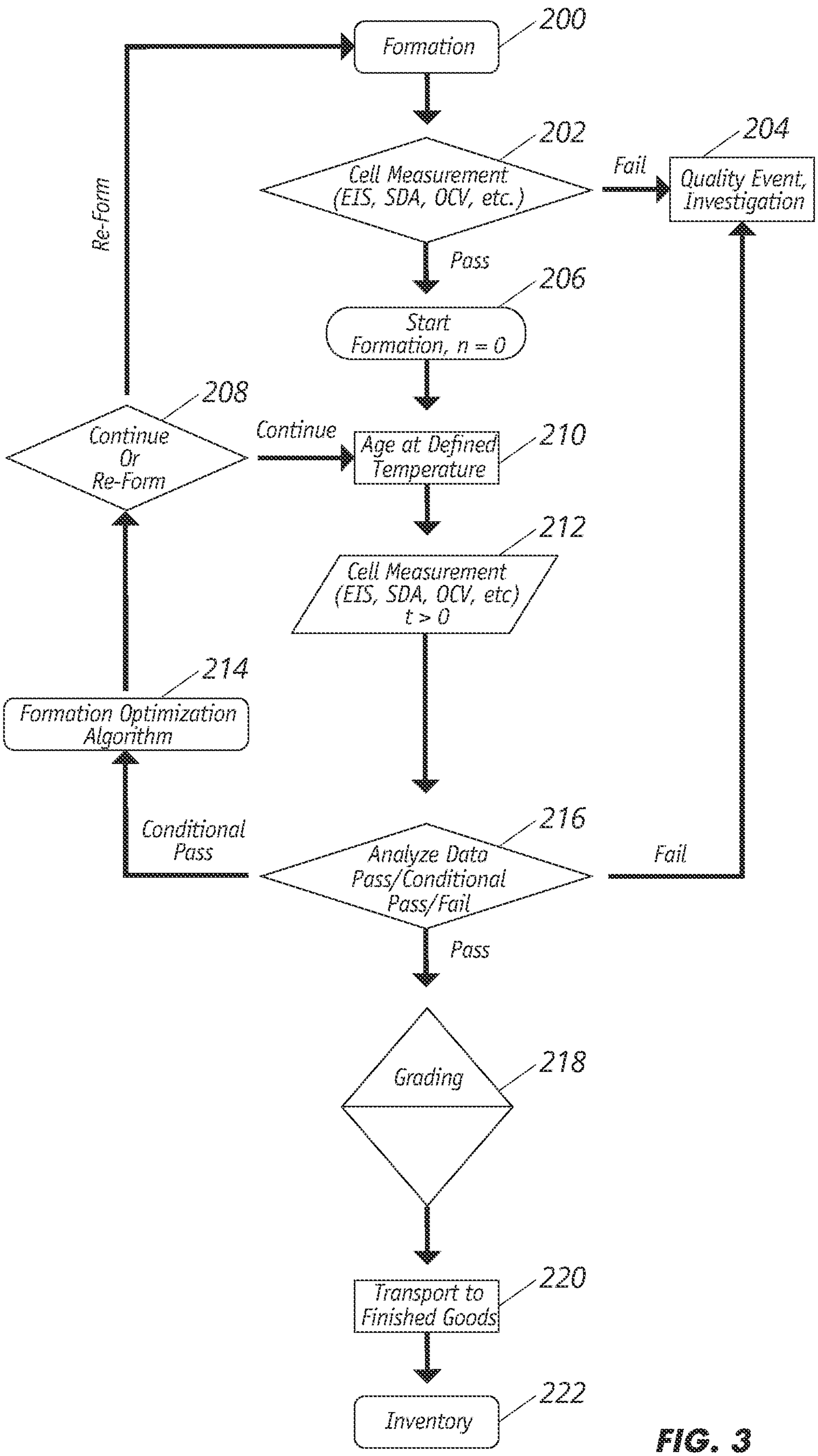
FIG. 3 is a flowchart of the aging process.

FIG. 3 depicts the aging process for batteries that have completed formation 200. The charged batteries are subject to initial cell measurements where batteries undergo one or more tests, such as, for example, EIS, SDA, amperometric, and potentiometric analyses. Batteries that fail are examined for quality defects 204. Those that pass continue to the formation step 206 where they are stored at a defined temperature for a specified length of the time in step 210. Thereafter, the batteries are subject to second cell measurements 212 and analysis of the data 216 identifies (i) defective batteries, which are investigated 204 (ii) batteries that meet certain quality specification but requires additional aging (conditional passing) and (iii) batteries that pass, which proceed to grading 218. After the grading, the finished batteries 220 are transported to inventory 222. Batteries which pass conditionally undergo formation/optimization algorithm 214 where they are tested to determine 208 whether they will continue another the aging step 210 or they will start again (re-form).

Figure 4:
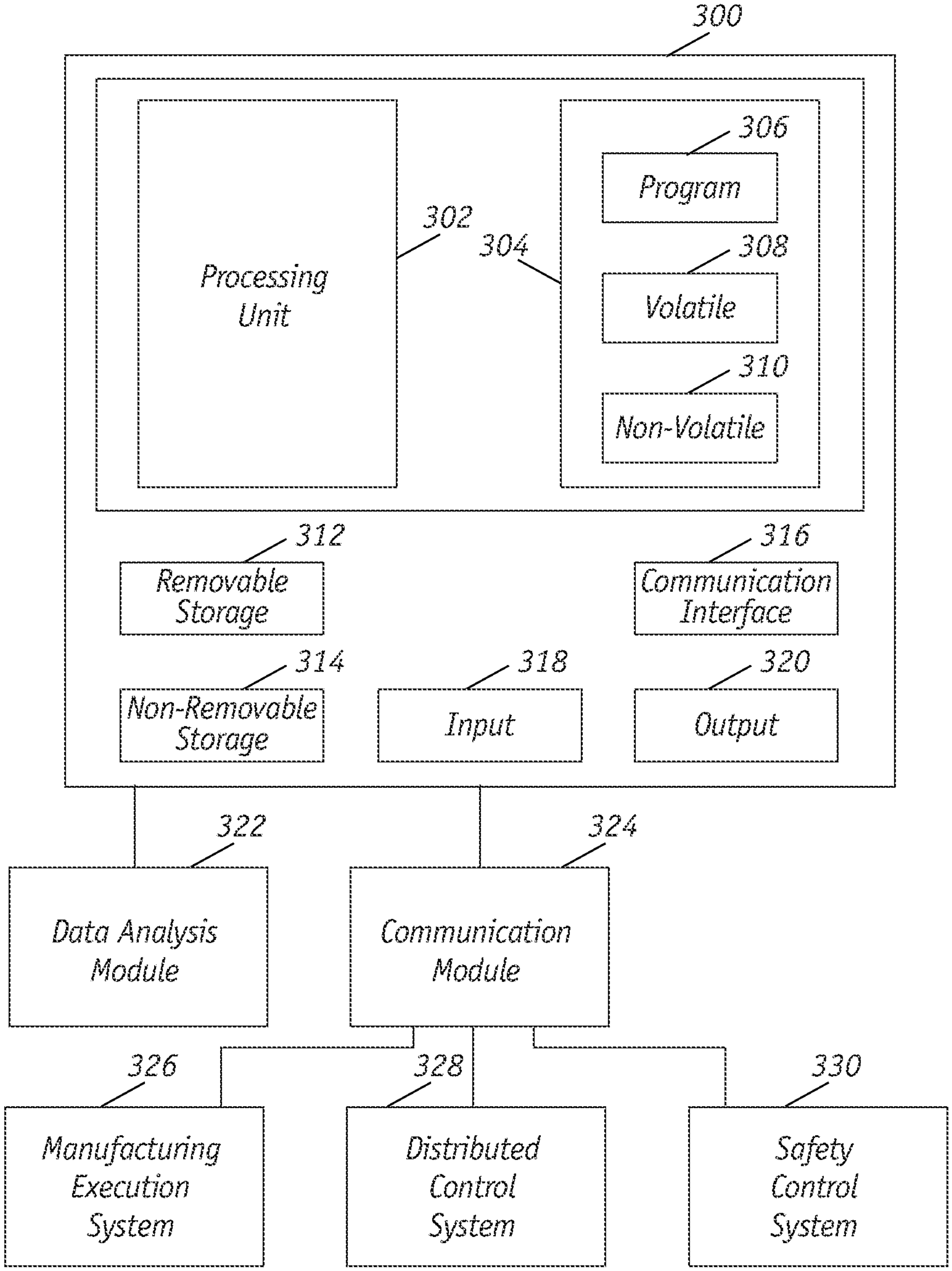
FIG. 4 shows a block diagram for a system for optimizing lithium-ion battery finishing.

FIG. 4 shows a control module 300 which regulates the functions of the manufacturing line 4 (FIG. 1). As used herein, the term "module" refers to any means for facilitating communications and/or interaction between the elements of the manufacturing line and performing additional processes, tasks and/or functions to support operation of the manufacturing line, as described herein. In various embodiments, the control module 300 may be any hardware, software, firmware, electronic control component, processing logic, and/or processor device, individually or in any combination. Depending on the embodiment, the control module 300 may be implemented or realized with a general purpose processor (shared, dedicated, or group) controller, microprocessor, or microcontroller, and memory that executes one or more software or firmware programs; a content addressable memory; a digital signal processor; an application specific integrated circuit (ASIC), a field programmable gate array (FPGA); any suitable programmable logic device; combinational logic circuit including discrete gates or transistor logic, discrete hardware components and memory devices; and/or any combination thereof, designed to perform the functions described herein.

The control module can comprise a computer system that includes a processing unit 302, a memory 304, a removable storage 312, and a non-removable storage 314. Although the example computing device is illustrated and described as the computer system, the computing device may be in different forms in different embodiments. For example, the computing device may instead be a smartphone, a tablet, a smartwatch, or other computing devices. Devices such as smartphones, tablets, and smartwatches are generally collectively referred to as mobile devices. Furthermore, although the various data storage elements are illustrated as part of the control module 300, the storage may also, or alternatively, include cloud-based storage accessible via a network, such as the Internet.

The memory 304 may include a volatile memory 308 and a non-volatile memory 310. The computer system may include—or have access to a computing environment that includes—a variety of computer-readable media, such as the volatile memory 308 and the non-volatile memory 310, the removable storage 312 and the non-removable storage 3144. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage, or other magnetic storage devices capable of storing computer-readable instructions for execution to perform functions described herein.

The computer system may include, or have access to, a computing environment that includes an input 318, an output 320, and a communication interface 316. The output 320 may include a display device, such as a touchscreen, that also may serve as an input device. The input 318 may include one or more of a touchscreen, touchpad, mouse, keyboard, camera, one or more device-specific buttons, one or more sensors integrated within, or coupled via, wired or wireless data connections to the control module 300, and other input devices 318. The computer system may operate in a networked environment using a communication connection to connect to one or more remote computers, such as database servers, including cloud-based servers and storage. The remote computer may include a personal computer (PC), server, router, network PC, a peer device or other common network node, or the like. The communication connection may include a Local Area Network (LAN), a Wide Area Network (WAN), cellular, WiFi. Bluetooth, or other networks.

Computer-readable instructions stored on a computer-readable storage device are executable by the processing unit 302. A hard drive. CD-ROM, and RAM are some examples of articles including a non-transitory computer-readable medium such as a storage device. The terms computer-readable medium and storage device do not include carrier waves. For example, a computer program 306 may be used to cause the processing unit 302 to perform one or more methods of the present invention.

Although a single control module can control the entire manufacturing line 4 (FIG. 1), it is understood that the individual stations of the manufacturing line can be equipped with a control module to specifically monitor and regulate the devices associated with the particular station. For instance, a data analysis module 322 is employed to receive and process in-line data for analysis and visualization. A communication module 324 is employed to transmit performance assessment metrics and adjust process parameters to a manufacturing execution system (MES) 326 or a distributed control system (DCS) 328 which can be located in remote servers. The MES or DCS in turn can direct the automated storage and retrieval systems and/or autonomous mobile robots to maneuver batteries within the formation, aging and sorting stations. The MES or DCS can be incorporated into computer system such as a "Centralized Operations Console" or "Integrated Operations Center," or equivalent, wherein data can be displayed in a human-machine interface (HMI). The communication module 324 can transmit in-line process information acquired from formation and aging stations to a safety control system 330, which is an early battery failure detection mechanism. For instance, it can provide early smoke or battery off gas and/or heat detection, thermal imaging, electrolyte vapor detection, and related safety measures that prevent thermal runaway.

The foregoing has described the principles, preferred embodiment and modes of operation of the present invention. However, the invention should not be construed as limited to the particular embodiments discussed. Instead, the above-described embodiments should be regarded as illustrative rather than restrictive, and it should be appreciated that variations may be made in those embodiments by workers skilled in the art without departing from the scope of present invention as defined by the following claims.

What is claimed is:

1. A system for dynamic control and optimization of a secondary battery cell finishing process, comprising:

a closed-loop process control module configured to;

receive in-line real-time process parameters related to one or more secondary batteries derived from at least one of electrochemical impedance spectroscopy (EIS), self-discharge analysis (SDA), amperometric, or potentiometric battery measurements from the secondary battery cell finishing process;

compare the in-line real-time process parameters related to the one or more secondary batteries against a corresponding set of pre-selected values to determine deviations in the in-line real-time process parameters; and in response to the determined deviations in the in-line real-time process parameters, controlling charging and discharging of the one or more secondary batteries during formation of a solid electrolyte interface (SEI) of an anode in the one or more secondary batteries and a cathode electrolyte interface (CEI) of a cathode in the one or more secondary batteries, wherein the charging and discharging of the one or more secondary batteries is controlled by performing at least one of:

executing charge protocols or discharge protocols for the one or more secondary batteries;

terminating charge or discharge of the one or more secondary batteries; or implementing alternate charge protocols or discharge protocols for the one or more secondary batteries.

2. The system of claim 1, wherein the in-line real-time process parameters are selected from a group consisting of ohmic resistance $R_{\Omega}$, charge transfer resistance $R_{ct}$, leakage current $I_{leak}$, open circuit voltage (OCV), voltage drop (AV), and combinations thereof.

3. The system of claim 1, further comprising:

an EIS measurement device that is operatively connected to secondary batteries and/or a SDA measurement device that is operatively connected to: at least one of the one or more secondary batteries or a SDA measurement device that is operatively connected to the one or more secondary batteries wherein the EIS measurement device is employed to determine an electrochemical condition of the solid electrolyte interface (SEI) of the anode in the one or more secondary batteries and the cathode electrolyte interface (CEI) of the cathode in the one or more secondary batteries.

4. The system of claim 3, further comprising:

a battery charging and discharging device operatively coupled to the closed-loop process control module, wherein the closed loop process control module is configured to control the battery charging and discharging device by generating a control signal based on the deviations, wherein the control signal directs one of: the EIS measurement device or the SDA measurement device to execute a set of pre-configured charge or discharge protocols for the one or more secondary batteries to adapt the in-line real-time process parameters related to the one or more secondary batteries closer to the set of pre-selected values.

5. The system of claim 1, wherein the closed-loop process control module is operatively connected to a data analysis module, wherein the data analysis module is configured to receive and process the in-line real-time process parameters for analysis and presentation in a visual format.

6. The system of claim 5, wherein the data analysis module further comprises a processor configured to:

(i) receive the in-line real-time process parameters from at least one of an EIS measurement device or a SDA measurement device, (ii) perform data processing and analysis using algorithms to determine performance assessment metrics of the one or more secondary batteries and adjusted in-line real-time process parameters, and (iii) present the performance assessment metrics to a user interface.

7. The system of claim 6, further comprising:

a communication module configured to transmit the performance assessment metrics and the adjusted in-line real-time process parameters to a remote server, Manufacturing Execution System (MES) or the Distributed Control System (DCS) for monitoring and analysis.

8. The system of claim 7, wherein the MES or the DCS directs an automated storage and retrieval system (AS/RS) or an autonomous mobile robot (AMR) to transport individual cells between formation, aging and/or sorting stations based on the performance assessment metrics and the adjusted in-line real-time process parameter received from the communication module.

9. The system of claim 7, where the MES and/or the DCS include a human-machine interface (HMI) and data from the MES and/or the DCS is displayed on the HMI to provide a centralized platform to visualize and control various processes, equipment, and systems employed in a manufacturing line for producing the one or more secondary batteries.

10. The system of claim 1, wherein the closed loop control module is configured to transmit the in-line real-time process parameters derived from formation and aging stations to a safety control system which provide advanced warning of premature cell failure.

11. The system of claim 1, wherein the closed-loop process control module is further configured to:

(i) process the in-line real-time process parameters related to the one or more secondary batteries from charge/discharge functions, electrochemical impedance spectroscopy (EIS) measurements, self-discharge analysis measurements (SDA), amperometric measurements, and/or potentiometric measurements, (ii) identify deviations of battery performance of the one or more secondary batteries from a norm, and (iii) identify historical battery manufacturing operation conditions that potentially contribute to battery performance deviations from the norm.

12. The system of claim 11, wherein the deviations can be characterized as being better or worse than the norm.

13. The system of claim 11, wherein the deviations of the battery performance are determined from at least one of: (i) a statistical analysis of the in-line real-time process parameters, (ii) a rate-of change comparison of the in-line real-time process parameters with the norm, (iii) data extraction (dQ/dV), (iv) machine learning, and (v) artificial intelligence.

14. The system of claim 11, wherein historical data of the material components used in the one or more secondary batteries and the in-line real-time process parameters employed in fabricating the one or more secondary batteries are evaluated to determine their contributions to the battery performance deviations.

15. The system of claim 14, wherein the closed-loop process control module is configured to automatically adjust production parameters in a finishing process of the one or more secondary batteries to reduce the battery performance deviations.

16. The system of claim 14, wherein the closed-loop process control module is configured to issue automatic alerts and/or sequester battery components for additional evaluation.

17. The system of claim 11, wherein the closed-loop process control module is further configured to provide a real-time feedback alert to prevent thermal runaway during the secondary battery cell finishing process.

18. The system of claim 11, wherein historical data of the material components used in the secondary batteries and the in-line real-time process parameters employed in fabricating the one or more secondary batteries are evaluated to determine their contributions to the performance deviations.

19. The system of claim 1, wherein the deviations are determined from at least one of: (i) statistical analysis of the in-line real-time process parameters, (ii) rate-of change comparison, (iii) application of parameter limits, (iv) data extraction (dQ/dV), (v) machine learning, and (vi) artificial intelligence.

* * * * *